US006847218B1

(12) United States Patent
Nulty et al.

(10) Patent No.: US 6,847,218 B1
(45) Date of Patent: Jan. 25, 2005

(54) PROBE CARD WITH AN ADAPTER LAYER FOR TESTING INTEGRATED CIRCUITS

(75) Inventors: James E. Nulty, San Jose, CA (US); Brenor L. Brophy, San Jose, CA (US); Thomas A. McCleary, Los Gatos, CA (US); Bo Jin, Campbell, CA (US); Qi Gu, Fremont, CA (US); Thurman J. Rodgers, Woodside, CA (US); John O. Torode, Hunts Point, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/144,676

(22) Filed: May 13, 2002

(51) Int. Cl.[7] .......................... G01R 31/02; G01R 31/26
(52) U.S. Cl. ........................................ 324/754; 324/765
(58) Field of Search .............................. 324/754, 757, 324/758, 73.1, 158.1, 72.5, 762, 760, 765, 731; 438/14–18

(56) References Cited

U.S. PATENT DOCUMENTS

| | | | |
|---|---|---|---|
| 5,061,033 A | | 10/1991 | Richard |
| 5,477,160 A | * | 12/1995 | Love ........................... 324/755 |
| 5,807,767 A | | 9/1998 | Stroupe |
| 6,064,213 A | * | 5/2000 | Khandros et al. ............ 324/754 |
| 6,084,215 A | * | 7/2000 | Furuya et al. ............ 219/444.1 |
| 6,400,173 B1 | | 6/2002 | Shimizu et al. |
| 6,452,411 B1 | | 9/2002 | Miller et al. |
| 6,483,330 B1 | | 11/2002 | Kline |
| 6,527,563 B2 | | 3/2003 | Clayton |
| 6,531,335 B1 | | 3/2003 | Grigg |
| 6,551,844 B1 | * | 4/2003 | Eldridge et al. ............... 438/14 |
| 6,559,666 B2 | | 5/2003 | Bernier et al. |

OTHER PUBLICATIONS

PCT International Search Report for PCT/US03/14844 mailed Sep. 18, 2003, total of 2 sheets.

* cited by examiner

*Primary Examiner*—Kamand Cuneo
*Assistant Examiner*—Paresh Patel
(74) *Attorney, Agent, or Firm*—Okamoto & Benedicto LLP

(57) ABSTRACT

In one embodiment, an environment for testing integrated circuits includes a first die coupled to a tester. The first die includes a removable connection configured to couple a signal from the first die with an adapter layer to a second die being tested. The removable connection may be an elastomeric interposer or a probe, for example.

15 Claims, 7 Drawing Sheets

SECTION A-A

PROBE CARD WITH AN ADAPTER LAYER FOR TESTING INTEGRATED CIRCUITS

BACKGROUND OF THE INVENTION

1. Field of the Invention

The present invention relates generally to integrated circuits, and more particularly to methods and apparatus for testing integrated circuits.

2. Description of the Background Art

A test equipment unit for testing integrated circuits in die form is commonly referred to as a "tester". A typical tester can be coupled to a probe card, which includes probes for contacting pads of a die being tested. The probe card allows the tester to send and receive test related signals to and from the die.

The cost of testing dice is affected by the throughput of the tester. Generally speaking, throughput is a measure of how many dice can be tested within a period of time. The higher the throughput, the lower the cost of testing. The cost of testing is also affected by the cost of the probe card. Thus, it is desirable to have a probe card that can be manufactured at a relatively low cost. Advantageously, such a probe card should also minimize potential damage to dice being tested.

SUMMARY

In one embodiment, an environment for testing integrated circuits includes a first die coupled to a tester. The first die includes a removable connection configured to couple a signal from the first die to a second die being tested. The removable connection may be a constructive elastomeric interposer or a probe, for example.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of apparatus, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
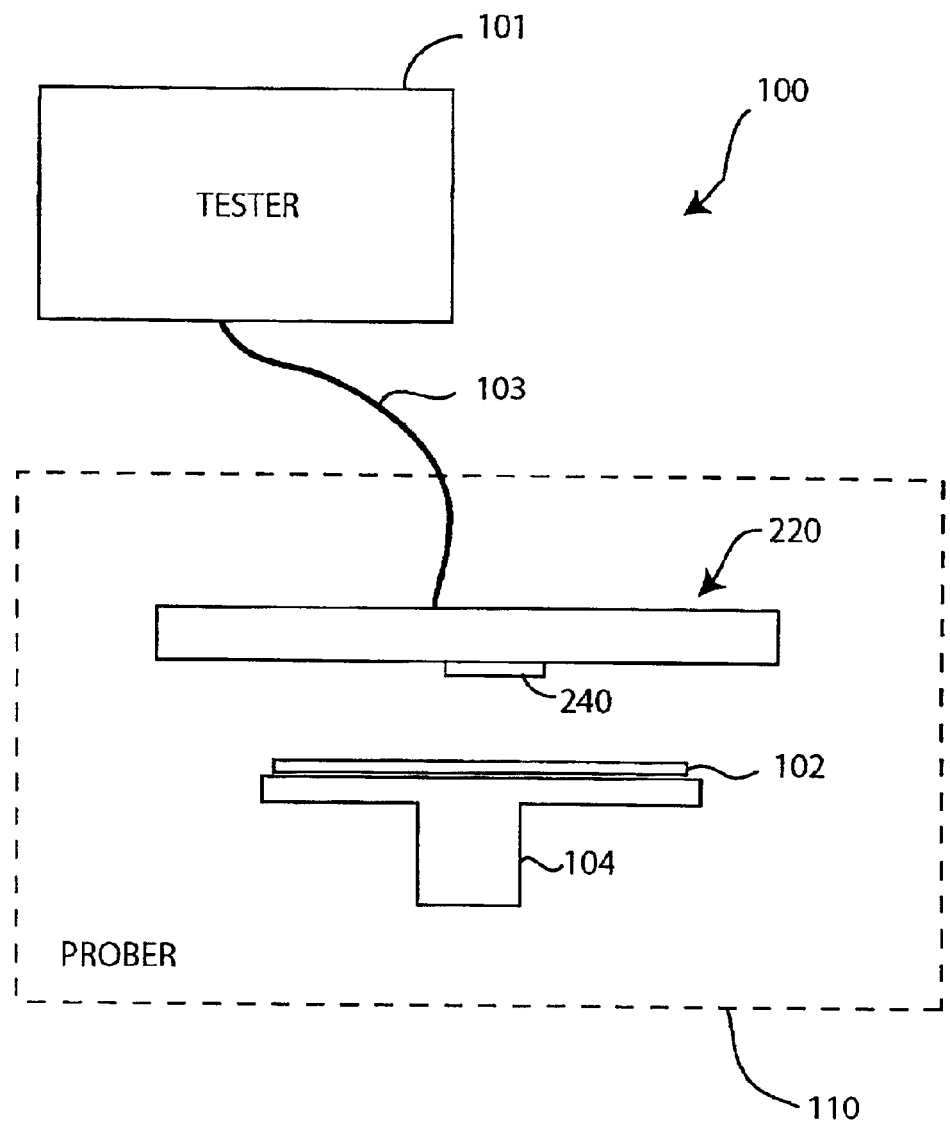
FIG. 1 shows a schematic diagram of a test environment in accordance with an embodiment of the present invention.

FIG. 1 shows a schematic diagram of a test environment 100 in accordance with an embodiment of the present invention. Test environment 100 may include a tester 101 and a prober 110. Tester 101 may be a commercially available test equipment product such as those of the type available from Advantest Corporation, for example. Prober 110 may house a probe card 220, chuck 104, and devices under test, which in this example are dice on a wafer 102. Chuck 104 supports wafer 102 during testing. Probe card 220 includes a test interface 240. Test interface 240 may be a substrate configurable to include an embedded integrated circuit. In one embodiment, test interface 240 includes one or more dice. Test interface 240 may include removable electrical connections to corresponding contact points (e.g., bumps, pads) on a die being tested. The removable electrical connections may be attached to a die on test interface 240. Removable electrical connections may include spring probes (e.g., spring probe 610 shown in FIG. 6), interposers (e.g., interposer 510 shown in FIG. 5), etc. During a test run, the removable electrical connections touch contact points on a die under test. The removable electrical connections are removed away from the die under test after the test is over. The removable electrical connections allow tester 101 to send stimulus signals to wafer 102 via a path including link 103, probe card 220, and test interface 240. Similarly, tester 101 may receive response signals from wafer 102 over the same path.

Figure 2A:
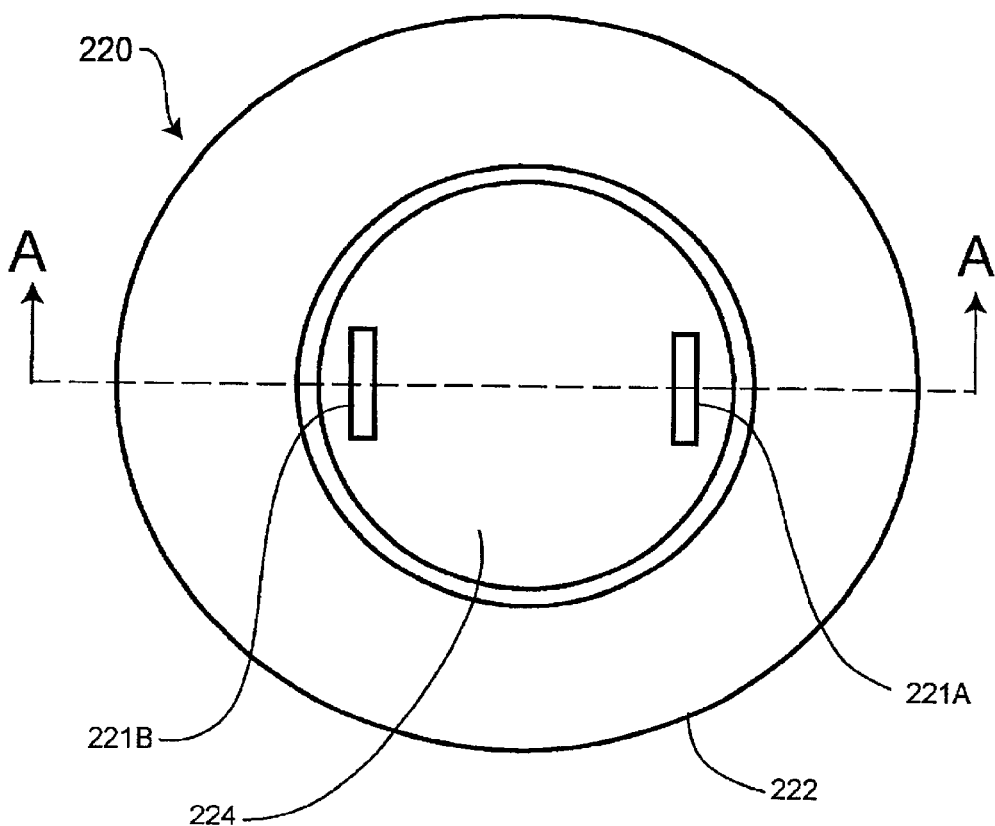
FIGS. 2A, 2B, and 2C schematically show various views of a probe card in accordance with an embodiment of the present invention.
Figure 2B:
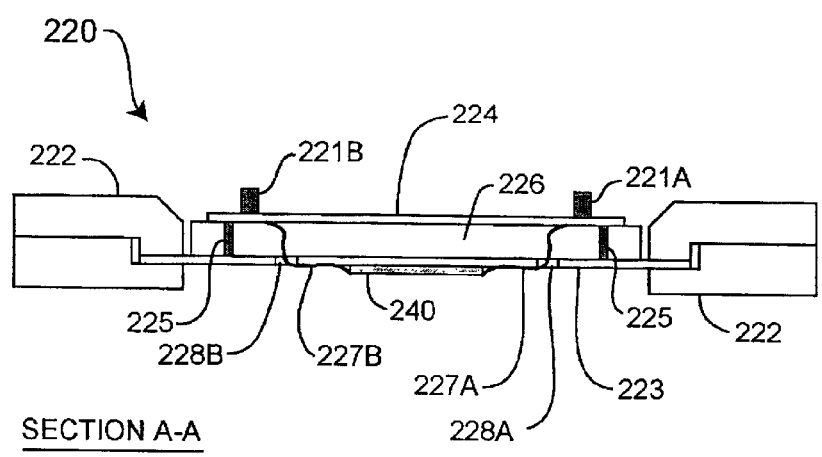
Figure 2C:
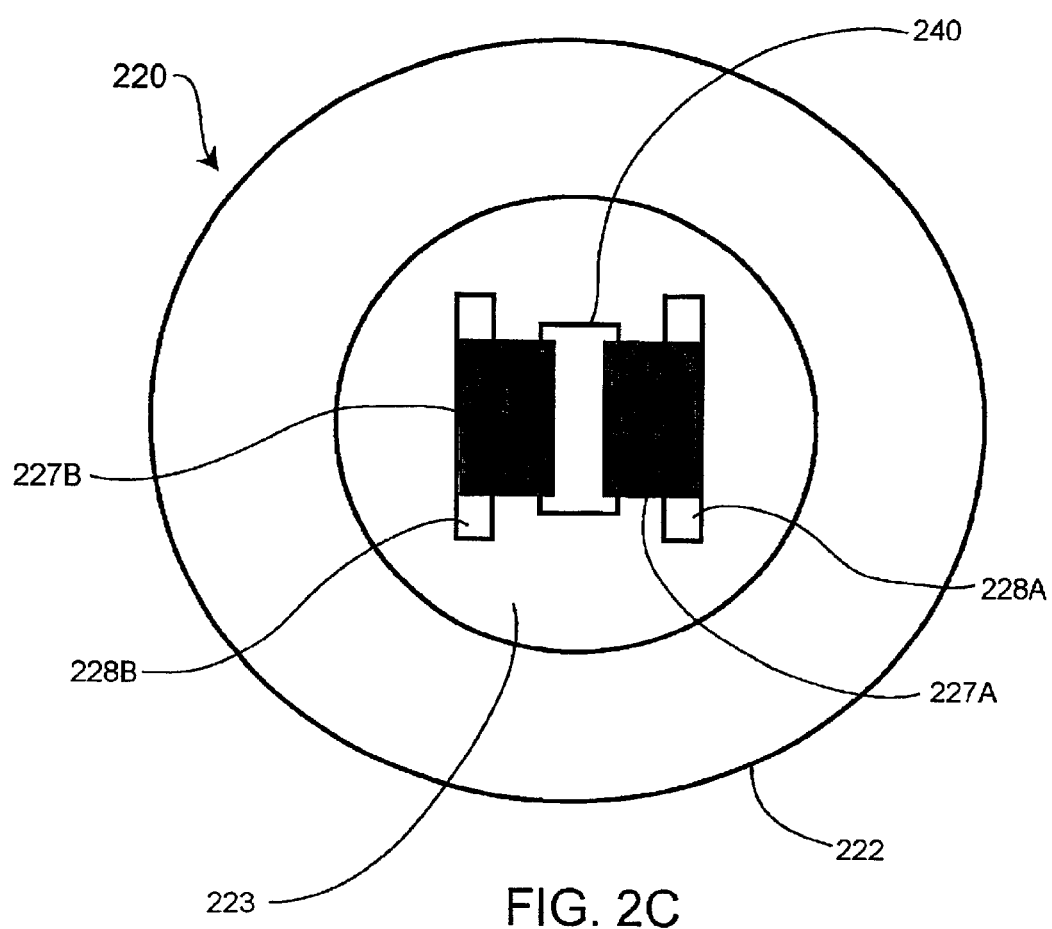

FIGS. 2A, 2B, and 2C schematically show various views of a probe card 220 in accordance with an embodiment of the present invention. FIG. 2A shows a top view of probe card 220, while FIG. 2B shows a side cross-sectional view taken at section A—A of FIG. 2A. A bottom view of probe card 220 is shown in FIG. 2C.

Referring to FIG. 2A, probe card 220 includes one or more connectors 221 (i.e., 221A, 221B) for electrically coupling probe card 220 to tester 101. For example, link 103 (see FIG. 1) may include wires that attach to connectors 221. In one embodiment, connectors 221 may be on a board 224. Board 224 may be, for example, a printed circuit board. Optionally, board 224 may include electrical circuits (not shown) for communicating with tester 101. For example, board 224 may be a printed circuit board with signal drivers and amplifiers.

As shown in the side cross-sectional view of FIG. 2B, board 224 may be disposed over a probe substrate 223. Spacers 225 may be employed to separate board 224 from probe substrate 223. In one embodiment, probe substrate 223 is a ceramic disk having dimensions comparable to that of commercially available probe cards. This advantageously allows probe card 220 to be used with commercially available testers. A prober ring 222 clamps probe substrate 223 and provides a handle that may be used to secure probe card 220 in place during testing.

In one embodiment, probe substrate 223 has a mirror coating (e.g., evaporated aluminum) on the side where test interface 240 is attached. The mirror coating provides a radiated heat barrier, thus allowing probe card 220 to be used in relatively high temperature (e.g., up to 135° C.) environments. Additionally, an insulation layer 226 (e.g., foam insulation) may be placed between probe substrate 223 and board 224 to minimize heat transfer by convection. Of course, probe card 220 does not necessarily require components for withstanding relatively high temperatures; probe card 220 may also be used in ambient and in relatively low temperature environments.

In one embodiment, cables 227 (i.e., 227A, 227B) provide electrical connections between board 224 and test interface 240. Cables 227 may be polymide flexible ribbon cables, for example. Cable 227A may go through a slot 228A to electrically connect test interface 240 to connector 221A. Likewise, cable 227B may go through a slot 228B to electrically connect test interface 240 to connector 221 B. The bottom view of FIG. 2C further illustrates how cables 227A and 227B may go through slots 228A and 228B, respectively, to electrically connect to test interface 240.

Figure 3:
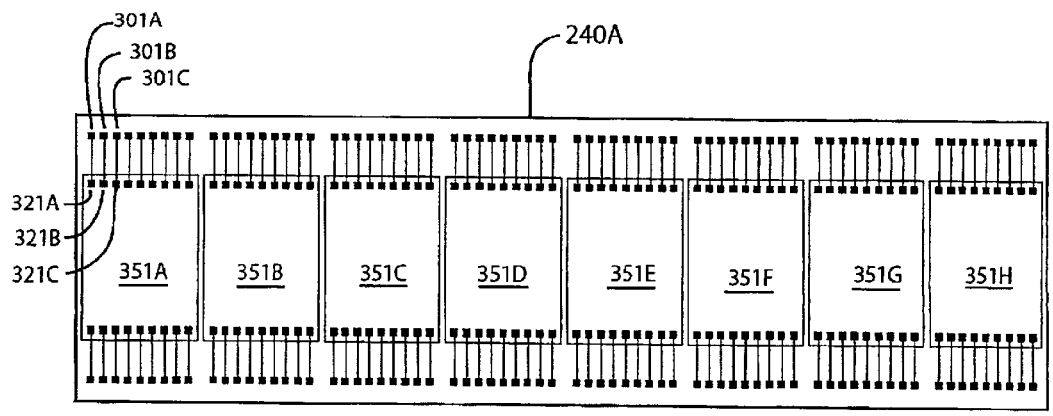
FIG. 3 shows a schematic diagram of a test interface in accordance with an embodiment of the present invention.

Referring now to FIG. 3, there is shown a schematic diagram of a test interface 240A in accordance with an embodiment of the present invention. Test interface 240A is a specific embodiment of test interface 240. Test interface 240A may be a strip of semiconductor wafer having one or more probe dice 351 (i.e., 351A, 351 B, ... ). Test interface 240A may include one or more interface pads 301 (i.e., 301A, 301 B, ... ), with each interface pad 301 being electrically connected to a wire of a cable 227 (see FIGS. 2B and 2C).

Each probe die 351 may include one or more probe die pads 321 (i.e., 321A, 321B, ... ). Each probe die pad 321, in turn, may be electrically connected to an interface pad 301. In the example of FIG. 3, probe die pad 321A is electrically connected to interface pad 301A, probe die pad 321B is electrically connected to interface pad 301 B, probe die pad 321C is electrically connected to interface pad 301C, etc. Note that only some of the probe die pads and interface pads shown in FIG. 3 are labeled for clarity of illustration.

As will be further discussed below, each probe die pad 321 includes a signal path to a die under test (hereinafter referred to as a "test die"). In one embodiment, a probe die 351 is a mirror image of a test die. When test interface 240A touches a wafer containing test dice, a removable electrical connection is made between test interface 240A and the wafer. This allows a tester 101 (see FIG. 1) to send and receive signals to and from a test die on the wafer.

Figure 4:
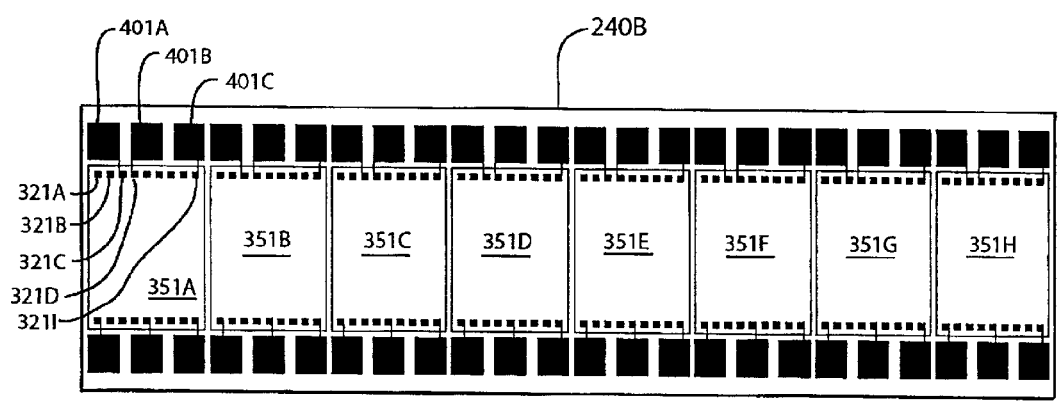
FIG. 4 shows a schematic diagram of a test interface in accordance with an embodiment of the present invention.

FIG. 4 shows a schematic diagram of a test interface 240B in accordance with an embodiment of the present invention. Test interface 240B is a specific embodiment of a test interface 240. Test interface 240B is similar to test interface 240A except that there are less interface pads in test interface 240B. Test interface 240B is particularly useful with test dice that have built-in self test ("BIST") capability. As is well known, a test die with BIST may be tested with a minimum of electrical connections to the test die. This is because the BIST may be activated with a minimum of stimulus signals. Thus, only some of probe die pads 321 may need to be electrically connected to an interface pad 401 (i.e., 401A, 401 B, ... ), which may be made larger because of more available space. This makes interface pads 401 easier to electrically connect to a cable 227. In the example of FIG. 4, probe die pad 321C is electrically connected to interface pad 401A, probe die pad 321D is electrically connected to interface pad 401B, probe die pad 321I is electrically connected to interface pad 401C, etc. Note that in the example of FIG. 4, probe die pads 321A and 321B are not connected to an interface pad 401. Also, only some of the probe die pads and interface pads in FIG. 4 are labeled for clarity of illustration.

As can be appreciated by those of ordinary skill in the art reading the present disclosure, a test interface 240 may be scaled to advantageously increase the throughput of a test environment. Specifically, the number of probe dice 351 of a test interface 240 may be increased so that more test dice may be tested within a given amount of time. For example, test interface 240A (see FIG.3) may be expanded from the depicted configuration of 8×1 probe dice (i.e., 8 probe dice in a single row), to a matrix of 7×7 probe dice and beyond. This will advantageously allow more test dice to be coupled to a tester 101 each time test interface 240A touches a wafer containing test dice.

Another advantage of using probe dice is that circuitry (not shown) may be incorporated in the probe dice to enhance the capability of the test environment. For example, a probe die 351 may be configured to include buffer and driver circuits to condition signals coming from or being transmitted to a test die. As another example, a probe die 351 may include circuitry similar to the BIST portion of a test die. Note that because a probe die 351 may be a die cut from a semiconductor wafer, integrated circuit manufacturing techniques may be employed to incorporate such circuits in a probe die 351.

Figure 5:
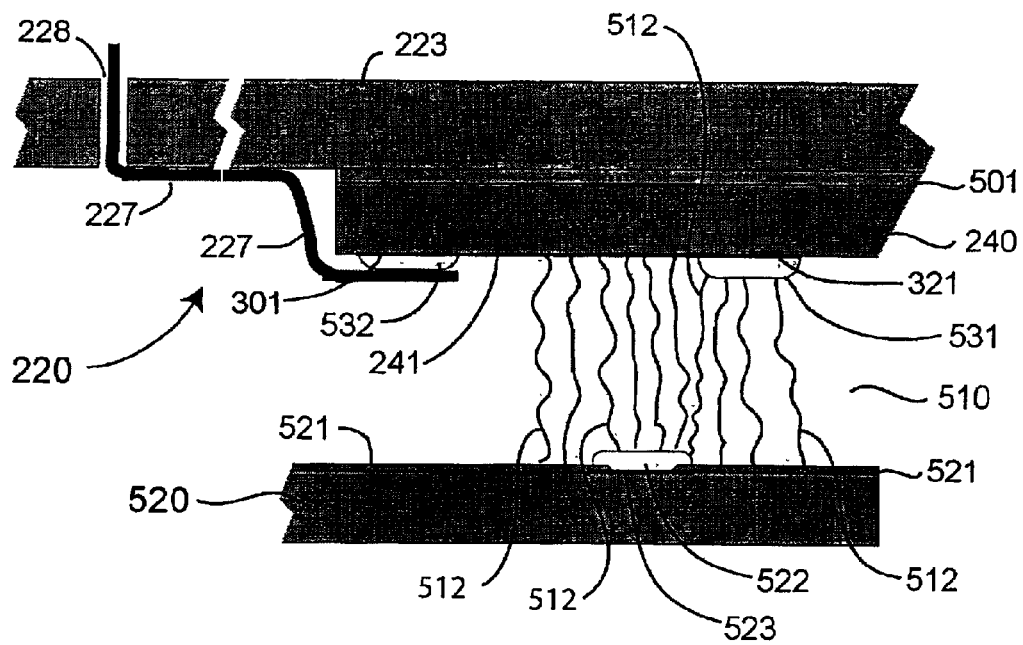
FIG. 5 schematically shows a side cross-sectional view of a portion of a probe card and a test die in accordance with an embodiment of the present invention.

FIG. 5 schematically shows a side cross-sectional view of a portion of a probe card 220 and a test die 520 in accordance with an embodiment of the present invention. Test interface 240 may be attached to a probe substrate 223 by epoxy bonding. The layer of epoxy attaching test interface 240 to probe substrate 223 is denoted in FIG. 5 as a bond layer 501. One way of forming bond layer 501 is as follows. First, a wafer that will be used to make test interface 240 is back-ground to create a good adhesion surface. Test interface 240 is then cut from the wafer. A low viscosity epoxy resin is then be applied on the ceramic probe substrate 223. Thereafter, test interface 240 is placed on the epoxy resin, leveled, and cured.

FIG. 5 also schematically shows a cable 227 electrically coupled to an interface pad 301. A cable 227 may be electrically coupled to an interface pad 301 by soldering or TAB bonding. If soldering is employed, an interface pad 301 may be pre-treated to make it solder wettable. For example, an interface pad 301 may be plated with a nickel/gold bump 532 to facilitate soldering. To facilitate TAB bonding, a gold bump 532 may first be bonded or plated to an interface pad 301. Thereafter, a cable 227 may be TAB bonded to the gold bump 532. A cable 227 may also be electrically coupled to an interface pad 301 using other attachment means without detracting from the merits of the present invention. For example, wire bonding may also be used.

As shown in FIG. 5, an interposer 510 may be employed to provide a removable electrical connection between a test interface 240 and a test die 520. In one embodiment, interposer 510 is a conductive elastomeric interposer such as that of the type available from Shin-Etsu Polymer Co. Ltd., of Japan under the product name "MT-type Interconnector™" interconnect material. Interposer 510 may include embedded conductive wires denoted in FIG. 5 as wires 512. Wires 512 electrically couple the probe die pad 321 and a test die pad 523. Note that only a few wires 512 are shown and labeled in FIG. 5 for clarity of illustration. Also in the example of FIG. 5, a probe die pad 321 and a test die pad 523 are depicted as having a bump 531 and a bump 522, respectively.

An interconnect line 241 provides an electrical connection between a probe die pad 321 and an interface pad 301. An interface pad 301 is electrically coupled to a cable 227 that, in turn, is electrically coupled to a tester 101. Thus, signals to and from a tester 101 may propagate over a path including a cable 227, an interface pad 301, an interconnect line 241, probe die pad 321, a wire 512, and a test die pad 523. Integrated circuits embodied in test die 520 may be electrically coupled to test die pad 523. To ensure a reliable electrical coupling between a test die pad 523 and a probe die pad 321 when using interposer 510, a bump 522 on a test die pad 523 may be formed such that it protrudes slightly above a passivation layer 521. For example, with a passivation layer 521 that is about 1 micron high, a bump 522 may be an electroless nickel/gold bump that is about 3 microns high. The just mentioned example may be used on a variety of test dice including those having a space of about 10 microns or more between pads.

Interposer 510 may be compressible (e.g., about 3 mils to 5 mils thick) to make up for imperfections in the planarity of test interface 240 and test die 520. In other words, interposer 510 may compress to make an electrical connection between test interface 240 and test die 520 even though one or both of them may not be perfectly flat. Interposer 510 may be glued to interface 240. For example, a high temperature adhesive may be used to glue interposer 510. Interposer 510 may also be inserted between test interface 240 and test die 520 before each test run.

The use of an interposer 510 helps minimize probing damage to test die 520. Unlike typical probes employed in commercially available probe cards, interposer 510 does not have sharp, pointy surfaces to scratch contact points (e.g., bumps, pads) of test die 520. Additionally, interposer 510 makes an electrical connection by compressing in the vertical direction. In contrast, a typical probe such as a cantilever probe applies both vertically and horizontally directed force on a contact point on a test die, increasing the chances of damaging the contact point.

Figure 6:
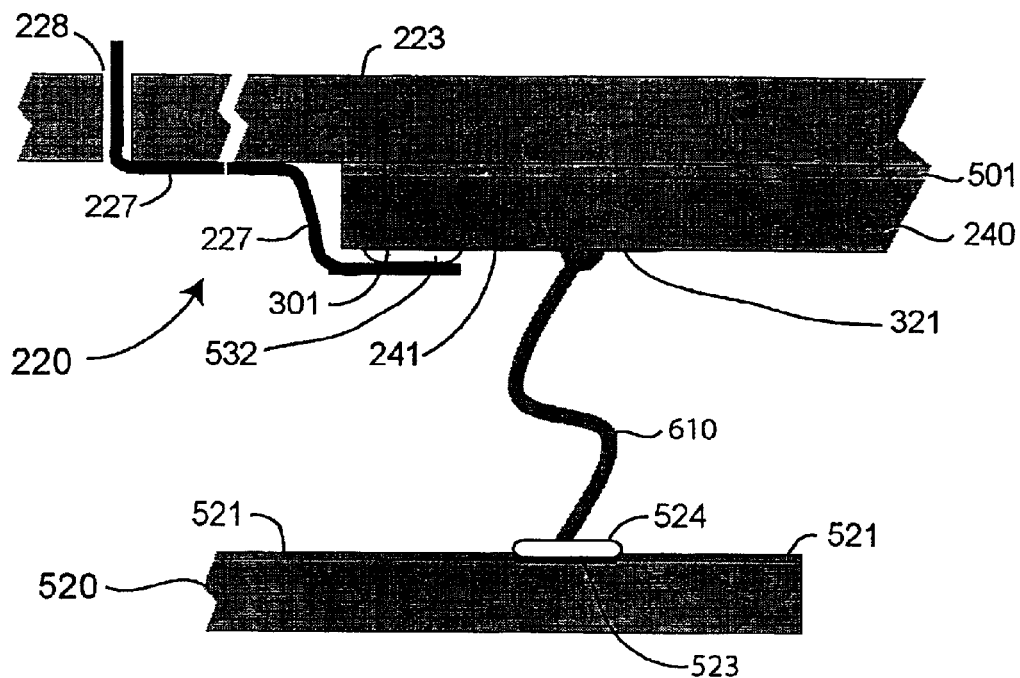
FIG. 6 schematically shows a side cross-sectional view of a portion of a probe card and a test die in accordance with an embodiment of the present invention.

FIG. 6 schematically shows a side cross-sectional view of a portion of a probe card 220 and a test die 520 in accordance with an embodiment of the present invention. In the example of FIG. 6, a spring probe 610 is employed to provide a removable electrical connection between a test interface 240 and a test die 220. A spring probe 610 may be of the same type as that employed on probe cards available from FormFactor, Inc. of Livermore, Calif. When pressed against a bump 524, a spring probe 610 provides an electrical coupling between a probe die pad 321 and a test die pad 523. In the example of FIG. 6, a test die pad 523 is depicted as optionally having a bump 524.

It is to be noted that other ways of providing a removable electrical connection between a test interface 240 and a test die 520 may also be used without detracting from the merits of the present invention. For example, a probe configured similarly to a pogo-stick (also referred to as a "pogo probe pin") may also be used. As another example, a conventional cantilever probe may be used instead of interposer 510 or spring probe 610.

Figure 7:
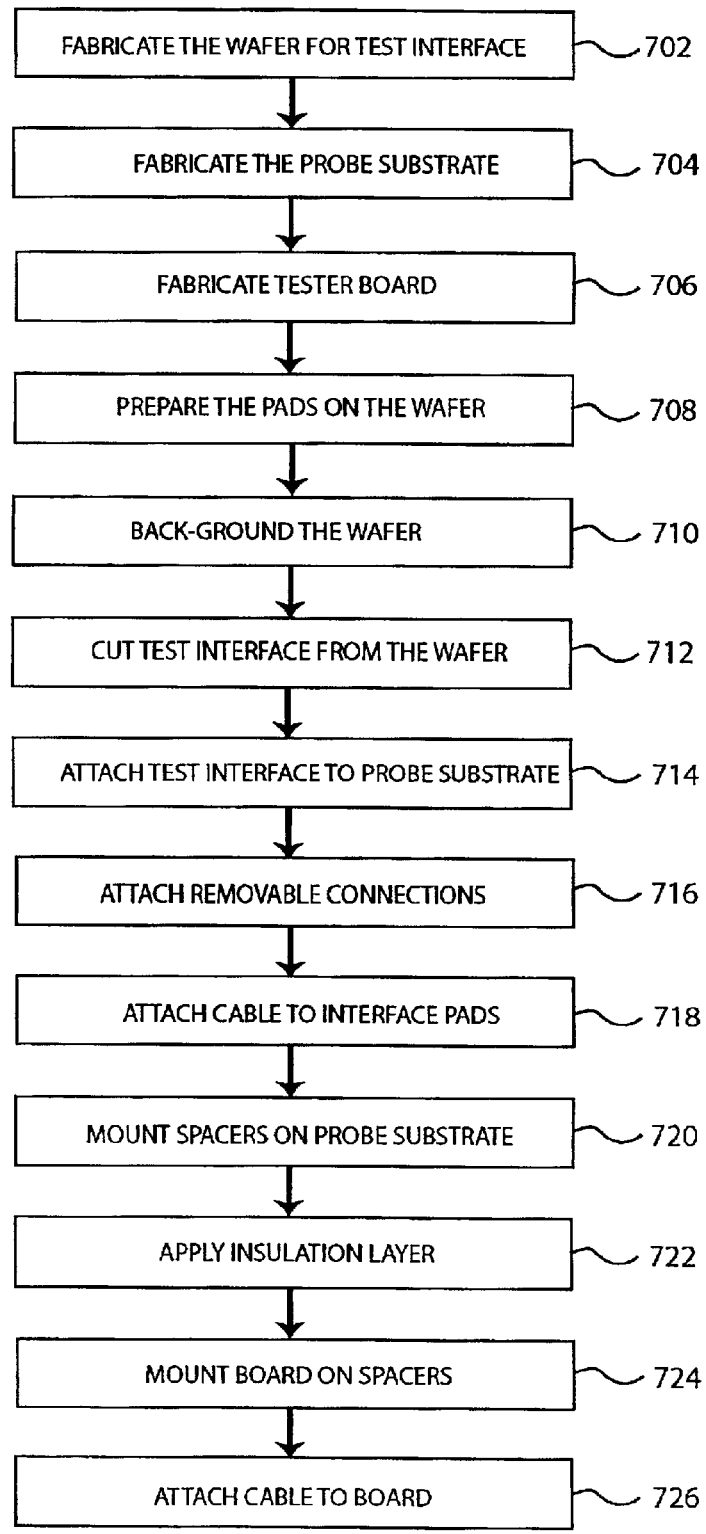
FIG. 7 shows a flow diagram of a method for constructing a probe card in accordance with an embodiment of the present invention.

FIG. 7 shows a flow diagram of a method for constructing a probe card (e.g., probe card 220) in accordance with an embodiment of the present invention. In action 702, a wafer for making a test interface (e.g., test interface 240) is fabricated. The wafer may be an 8 inch wafer with just metal and pad masks, for example. Optionally, the wafer may also include integrated circuits.

In action 704, a probe substrate (e.g., probe substrate 223) is fabricated. The probe substrate may be a ceramic disk with slots for routing cables, for example.

In action 706, a board (e.g., board 224) for interfacing with a tester is fabricated. The board may include connectors for electrically coupling the probe card to the tester. The board may also include circuitry configured to drive and buffer signals, for example.

In action 708, pads (e.g., interface pads 301, interface pads 401, probe pads 321) on the wafer are prepared. For example, bumps may be plated or bonded to the pads.

In action 710, the wafer is back-ground to provide a good adhesion surface.

In action 712, a test interface (e.g., test interface 240) is cut from the wafer. The test interface may include one or more probe dice (e.g., probe dice 351) for electrically coupling the probe card to test dice.

In action 714, the test interface is attached to the probe substrate. For example, a low viscosity epoxy may be applied on the probe substrate. The test interface may then be placed on the epoxy, leveled, and cured.

In action 716, removable electrical connections (e.g., interposer 510, spring probe 610) are attached to the test interface.

In action 718, cables (e.g., cables 227) are attached to interface pads (e.g., interface pads 301, 401) on the test interface. For example, the cables may be soldered or TAB bonded to bumps on the interface pads.

In action 720, spacers (e.g., spacers 225) are mounted on the probe substrate.

In action 722, a heat insulation layer (e.g., insulation layer 226) is applied on the probe substrate. The heat insulation layer may be foam insulation, for example.

In action 724, the board is mounted on the spacers.

In action 728, the cables are attached to the board. In one embodiment, the cables are soldered to connectors on the board.

As can be appreciated by those of ordinary skill in the art reading the present disclosure, employing a die as a test interface provides several advantages heretofore unrealized. As mentioned, a probe die is scalable and optionally allows for incorporation of integrated circuits. Additionally, once a probe die is fabricated, it may be adapted to match the pad layout of various test dice. For example, an additional layer with another probe die pad layout may be formed over a probe die. Compared to manufacturing a completely new probe card for each new test die, adding a layer on an existing probe die is relatively inexpensive and does not require a lot of development time. This aspect of the present invention is now discussed with reference to FIGS. 8A–8E.

Figure 8A:
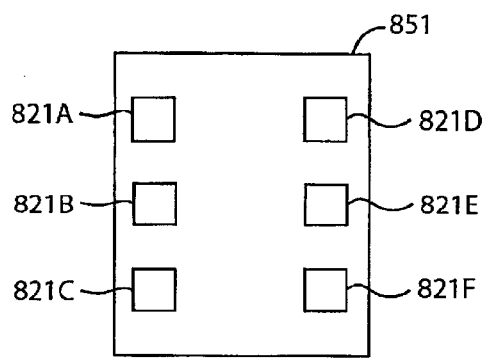
FIGS. 8A–8E show schematic diagrams illustrating how a test interface may be adapted to work with various test die pad layouts in accordance with an embodiment of the present invention.
Figure 8B:
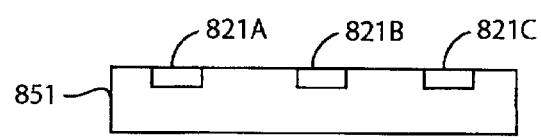

FIGS. 8A–8E show schematic diagrams illustrating how a test interface may be adapted to work with various test die pad layouts in accordance with an embodiment of the present invention. FIG. 8A shows a top view of a probe die 851. Probe die 851 is a specific embodiment of a probe die 351 shown in FIGS. 3 and 4. Similar to a probe die 351, probe die 851 includes probe die pads labeled in FIGS. 8A–8E as probe die pads 821 (i.e., 821A, 821B, . . . ). FIG. 8B shows a side cross-sectional view of probe die 851.

Probe die pads 821 are configured to match corresponding contact points on a particular test die. In other words, probe die 851 is designed for a particular test die pad layout. If the test die pad layout changes, an additional layer may be formed on top of probe die 851. The additional layer may include probe die pads configured to match the new test die pad layout.

Figure 8C:
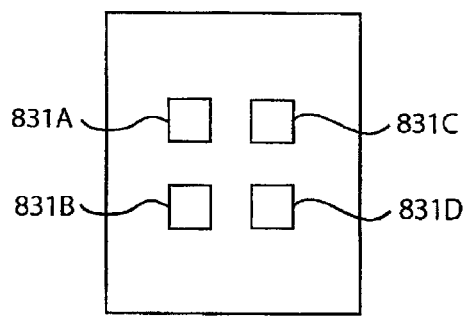
Figure 8D:
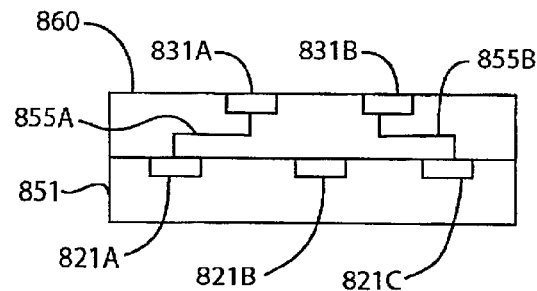
Figure 8E:
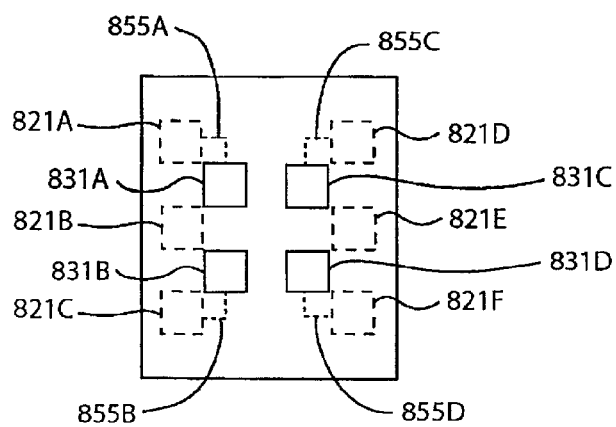

In the example of FIGS. 8A–8E, the probe die pad layout of FIG. 8A will be changed to that shown in the top view of FIG. 8C. Thus, in accordance with an embodiment of the present invention, a layer 860 may be formed over probe die 851 as shown in the side cross-sectional view of FIG. 8D. Layer 860 includes probe die pads 831 (i.e., 831A, 831 B, . . . ) that are electrically connected to corresponding probe die pads 821. In the example of FIG. 8D, an interconnect line 855A electrically connects probe die pad 821A to probe die pad 831A, an interconnect line 855B electrically connects probe die pad 821C to probe die pad 831 B, and so on. FIG. 8E shows a top x-ray view illustrating the electrical connections between probe die pads 821 and probe die pads 831.

An improved probe card has been disclosed. While specific embodiments have been provided, it is to be understood that these embodiments are for illustration purposes and not limiting. Many additional embodiments will be apparent to persons of ordinary skill in the art reading this disclosure.

Thus, the present invention is limited only by the following claims.

What is claimed is:

1. A test environment comprising:
   a first die coupled to a tester;
   a second die configured for test;
   an adapter layer over the first die and between the first die and the second die, the adapter layer being configured to adapt a pad layout of the first die to a pad layout of the second die; and
   a removable connection between the adapter layer and the second die, the removable connection being configured to couple a signal from the first die to a contact point on the second die.

2. The test environment of claim 1 wherein the removable connection comprises a conductive elastomeric interposer.

3. The test environment of claim 1 wherein the removable connection comprises a probe attached to the first die.

4. The test environment of claim 1 wherein the first die is part of an array of dice.

5. The test environment of claim 1 wherein the second die is part of a semiconductor wafer.

6. The test environment of claim 1 further comprising:
   a pad on the first die coupled to a pad on the second die by way of the adapter layer.

7. The test environment of claim 1 further comprising:
   a heat insulator between a substrate and a board coupled to the tester, the first die being attached to the substrate.

8. The test environment of claim 7 wherein the substrate comprises a ceramic disk.

9. The test environment of claim 1 wherein the first die is on a probe card.

10. A method of testing integrated circuits, the method comprising:
    generating a signal; and
    removably coupling the signal from a first die to a contact point on a second die by way of a layer, the layer being on the first die and between the first die and the second die, the layer configured to adopt a pad layout of the second die, the second die being configured for test, wherein removably coupling the signal from the first die to the contact point on the second die includes providing an elastomeric interposer between the first die and the second die.

11. The method of claim 10 wherein the signal is generated by a tester.

12. The method of claim 10 wherein removably coupling the signal from the first die to the contact point on the second die includes touching the contact point with a probe.

13. The method of claim 10 wherein the second die is part of a wafer.

14. The method of claim 10 wherein the contact point comprises a pad.

15. A probe card for testing integrated circuits, the probe card comprising:
    die means for receiving a signal from a tester;
    adapter means for adapting a pad layout of the die means to a pad layout of a die configured for test; and
    interposer means for coupling the signal from the die means to the die configured for test.

* * * * *

UNITED STATES PATENT AND TRADEMARK OFFICE
CERTIFICATE OF CORRECTION

PATENT NO. : 6,847,218 B1
DATED : January 25, 2005
INVENTOR(S) : Nulty et al.

It is certified that error appears in the above-identified patent and that said Letters Patent is hereby corrected as shown below:

Column 8,
Lines 1-12, claim 10 should read,
-- 10. A method of testing integrated circuits, the method comprising: generating a signal; and
removably coupling the signal from a first die to a contact point on a second die by way of a layer, the layer being on the first die and between the first die and the second die, the layer configured to adapt a pad layout of the first die to a pad layout of the second die, the second die being configured for test, wherein removably coupling the signal from the first die to the contact point on the second die includes providing an elastomeric interposer between the first die and the second die. --

Lines 15-17, claim 12 is removed and not part of the patent.

Signed and Sealed this

Thirty-first Day of May, 2005

JON W. DUDAS
*Director of the United States Patent and Trademark Office*